United States Patent
Wang et al.

(10) Patent No.: US 7,071,066 B2
(45) Date of Patent: Jul. 4, 2006

(54) METHOD AND STRUCTURE FOR FORMING HIGH-K GATES

(75) Inventors: Ming-Fang Wang, Taichung (TW); Chia-Lin Chen, Hsinchu (TW); Chih-Wei Yang, Kaohsiung (TW); Chi-Chun Chen, Kaohsiung (TW); Tuo-Hung Hou, Chia-Yi (TW); Yeou-Ming Lin, Jungli (TW); Liang-Gi Yao, Hsing-Chu (TW); Shih-Chang Chen, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/662,845

(22) Filed: Sep. 15, 2003

(65) Prior Publication Data

US 2005/0056900 A1 Mar. 17, 2005

(51) Int. Cl.
*H01L 21/336* (2006.01)
*H01L 21/3205* (2006.01)
*H01L 21/4763* (2006.01)

(52) U.S. Cl. .................. 438/301; 458/303; 458/591; 458/595

(58) Field of Classification Search ........ 438/300–305, 438/591–595
See application file for complete search history.

(56) References Cited

U.S. PATENT DOCUMENTS

| | | | | |
|---|---|---|---|---|
| 5,425,392 A | * | 6/1995 | Thakur et al. | 438/592 |
| 6,020,260 A | * | 2/2000 | Gardner | 438/657 |
| 6,573,193 B1 | * | 6/2003 | Yu et al. | 438/595 |
| 6,603,181 B1 | * | 8/2003 | Solomon et al. | 257/412 |
| 6,682,973 B1 | * | 1/2004 | Paton et al. | 438/240 |
| 6,717,226 B1 | * | 4/2004 | Hegde et al. | 257/406 |

* cited by examiner

*Primary Examiner*—Cuong Nguyen
(74) *Attorney, Agent, or Firm*—Thomas, Kayden, Horstemeyer & Risley

(57) ABSTRACT

A method for forming an improved gate stack structure having improved electrical properties in a gate structure forming process A method for forming a high dielectric constant gate structure including providing a silicon substrate comprising exposed surface portions; forming an interfacial layer over the exposed surface portions having a thickness of less than about 10 Angstroms; forming a high dielectric constant metal oxide layer over the interfacial layer having a dielectric constant of greater than about 10; forming a barrier layer over the high dielectric constant metal oxide layer; forming an electrode layer over the barrier layer; and, etching according to an etching pattern through a thickness of the electrode layer, barrier layer, high dielectric constant material layer, and the interfacial layer to form a high dielectric constant gate structure.

11 Claims, 3 Drawing Sheets

METHOD AND STRUCTURE FOR FORMING HIGH-K GATES

FIELD OF THE INVENTION

The present invention relates generally to CMOS device fabrication processes and, more particularly, to a structure and method of manufacturing high dielectric constant gate structures for improved integration with polysilicon gate electrodes to achieve improved electrical properties.

BACKGROUND OF THE INVENTION

Fabrication of a metal-oxide-semiconductor (MOS) integrated circuit involves numerous processing steps. A gate dielectric, typically formed from silicon dioxide, is formed on a semiconductor substrate which is doped with either n-type or p-type impurities. For each MOS field effect transistor (MOSFET) being formed, a gate electrode is formed over the gate dielectric, and dopant impurities are introduced into the substrate to form source and drain regions. A pervasive trend in modern integrated circuit manufacture is to produce transistors having feature sizes as small as possible. Many modern day semiconductor microelectronic fabrication processes form features having less than 0.25 critical dimensions, for example in future processes even less than 0.13 microns. As feature size decreases, the size of the resulting transistor as well as transistor features also decrease. Fabrication of smaller transistors allows more transistors to be placed on a single monolithic substrate, thereby allowing relatively large circuit systems to be incorporated on a single die area.

In semiconductor microelectronic device fabrication, polysilicon and silicon dioxide ($SiO_2$) are commonly used to respectively form gate electrodes and gate dielectrics for metal-oxide-semiconductor (MOS) transistors. As device dimensions have continued to scale down, the thickness of the $SiO_2$ gate dielectric layer has also decreased to maintain the same capacitance between the gate and channel regions. A thickness of the gate oxide layer of less than 2 nanometers (nm) will be required to meet smaller device design contraints. A problem with using $SiO_2$ as the gate dielectric is that thin $SiO_2$ oxide films may break down when subjected to electric fields expected in some operating environments, particularly for gate oxides less than about 50 Angstroms thick. In addition, electrons more readily pass through an insulating gate dielectric as it gets thinner due to what is frequently referred to as the quantum mechanical tunneling effect. In this manner, a tunneling current, produces a leakage current passing through the gate dielectric between the semiconductor substrate and the gate electrode, increasingly adversely affecting the operability of the device. Another increasing problem is the formation of trapping states and interfacial charged states at the silicon/gate dielectric interface which increasingly adversely affects device electrical characteristics. For example, as the trapped charges accumulate over time, the threshold voltage $V_T$ may shift from its design specification. Dielectric breakdown of thinner gate dielectrics is also likely to occur at lower values of applied gate voltage in part due to an increase in the relative volume of defects in the gate dielectric. Such defects have an increasingly adverse effect as the gate dielectric gets thinner. For example, a thin gate oxide often includes defects due to uneven growth of the gate oxide due to defects at the silicon surface.

Because of high direct tunneling currents, $SiO_2$ films thinner than 1.5 nm cannot be used as the gate dielectric in CMOS devices. There are currently intense efforts to replace $SiO_2$ with high-k (high dielectric constant) dielectrics, including for example, $TiO_2$, $Ta_2O_5$, $ZrO_2$, $Y_2O_3$, $La_2O_5$, $HfO_2$, and their aluminates and silicates attracting the greatest attention. A higher dielectric constant gate dielectric allows a thicker gate dielectric to be formed which dramatically reduces tunneling current and consequently gate leakage current, thereby overcoming a severe limitation in the use of $SiO_2$ as the gate dielectric. While silicon dioxide ($SiO_2$) has a dielectric constant of approximately 4, other candidate high-k dielectrics have significantly higher dielectric constant values of, for example, 20 or more. Using a high-k material for a gate dielectric allows a high capacitance to be achieved even with a relatively thick dielectric. Typical candidate high-k dielectric gate oxide materials have high dielectric constant in the range of about 20 to 40.

There have been, however, difficulties in forming high-k gate oxide dielectrics to achieve acceptable processing integration between the high-k gate dielectric and the polysilicon electrode formed overlying the high-k gate dielectric. For example, post deposition annealing treatments of high-k dielectric layers in the presence of oxygen have been found to detrimentally affect high-k dielectric films by leading to crystallization of the film and formation of an interfacial $SiO_2$ layer during the annealing treatment. $SiO_2$ interfacial layer formation at material layer interfaces creates a low dielectric constant layer in series with the high dielectric layer and therefore reduces the effective capacitance of the stacked layers.

Another problem associated with the above-mentioned high-k dielectrics is that the forming of a crystalline structure under normal preparation conditions leads to a roughened film surface. Surface roughness causes non-uniform electrical fields in the channel region adjacent the dielectric film. Such films are not suitable for the gate dielectrics of MOSFET devices.

Other processing difficulties with high-k dielectric materials include the tendency that high-k dielectric materials are relatively difficult to etch, unlike a conventional thermally grown oxide. Chemical etchants used with high-k materials may cause damage to associated oxide materials making high temperature rapid thermal oxidation (RTO) processes necessary to repair such damage while leading to the undesirable effect of crystallization of an amorphous high-k dielectric film. Proposed solutions to improve processing condition for forming high-k gate dielectrics with acceptable electrical properties, such as capacitance and leakage current, have included efforts to improve the thermal stability of the high-k dielectric films thereby avoiding film crystallization, or to provide processes whereby lower process temperatures (lower thermal budgets) are achieved, which have met with limited success.

Therefore it would be advantageous to develop a reliable method and structure for forming high-k gate dielectrics with associated gate electrodes that overcome the shortcomings of the prior art including improved electrical properties.

It is therefore an object of the invention to provide a reliable method for forming high-k gate dielectrics with associated gate electrodes that overcome the shortcomings of the prior art including improved electrical properties.

SUMMARY OF THE INVENTION

To achieve the foregoing and other objects, and in accordance with the purposes of the present invention, as embodied and broadly described herein, the present invention provides a method for forming a gate stack having improved electrical properties in a gate structure forming process.

In a first embodiment, the method includes providing a semiconductor substrate; forming a metal oxide layer over an exposed portion of the semiconductor substrate; and, forming a layer of polysilicon over the metal oxide layer according to an LPCVD process comprising a nitrogen containing ambient.

In another embodiment, the method forms an improved high dielectric constant gate structure including an interfacial layer disposed over and contacting a silicon substrate having a thickness of less than about 10 Angstroms; a high dielectric constant metal oxide layer disposed over and contacting the interfacial layer having a dielectric constant of greater than about 10; a barrier layer disposed over and contacting the high dielectric constant metal oxide layer; and, an electrode layer comprising polysilicon disposed over and contacting the barrier layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to the use of exemplary high-k gate dielectrics it will be appreciated that the method of the present invention may be adapted for the use of any high-k material in the formation of a gate dielectric. By the term high-k dielectric is meant a material that has a dielectric constant of greater than about 10. The term "substrate" is defined to mean any semiconductive substrate material including conventional semiconductor wafers.

Figure 1:
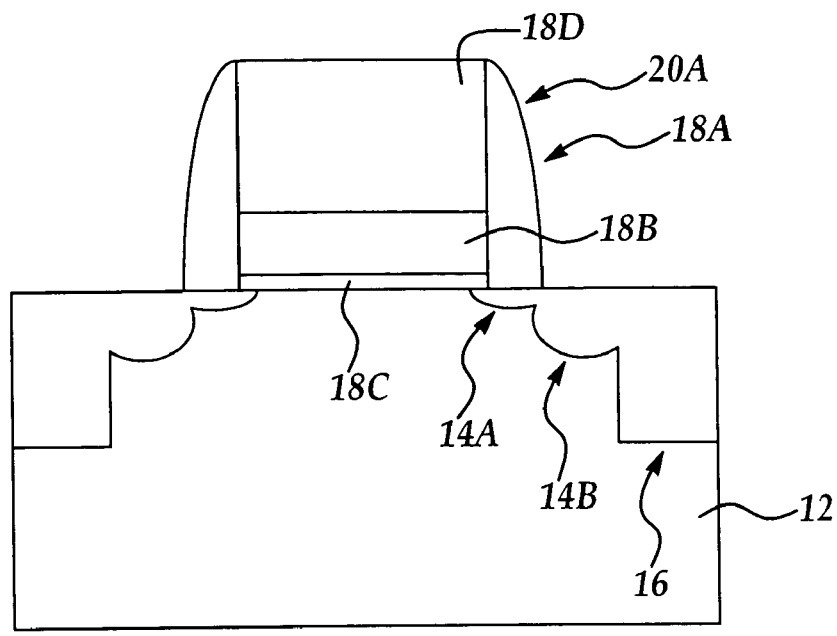
FIG. 1 is a cross sectional side view of an exemplary CMOS transistor according to an exemplary implementation of an embodiment of the present invention.

Referring to FIG. 1 is shown a cross sectional side view of an exemplary CMOS transistor having a high-k dielectric gate structure 18A including a gate stack according to an embodiment of the present invention. Shown is a semiconductor substrate 12, for example a silicon substrate including lightly doped regions e.g., 14A, source/drain regions, e.g., 14B and shallow trench isolation regions, e.g., 16 formed in the silicon substrate by conventional methods known in the art. The regions 14A and 14B are typically formed following the formation of the gate structure by ion implantation and annealing processes known in the art. Typically the ion implantation process is carried out following formation of the gate structure 18A including the gate dielectric region 18B formed of multiple layers including for example, an interfacial silicon dioxide layer 18C, and gate electrode portion 18D, for example polysilicon. The gate structure is typically formed by conventional photolithographic patterning and anisotropic etching steps following polysilicon deposition. Following gate structure formation a first ion implantation process is carried out to form LDD regions e.g., 14A in the silicon substrate. Sidewall spacers e.g., 20A, are formed including for example at least one of silicon oxide (e.g., $SiO_2$), silicon oxynitride (e.g., SiON), and silicon nitride (e.g., SiN) including multiple layered spacers by methods known in the art including conventional deposition and etchback processes. A second ion implantation process is then carried out to form the source/drain regions e.g., 14B in a self aligned ion implantation process where the sidewall spacers e.g., 20A act as an implantation mask to form N type or P type doping regions depending on whether a PMOS or NMOS type device is desired.

Figure 2A:
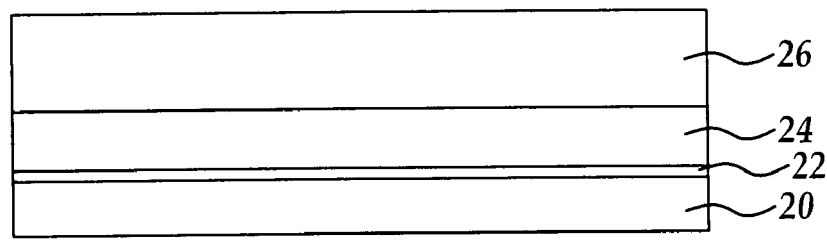
FIGS. 2A–2B are cross sectional side views of a portion of a gate structure showing exemplary embodiments of the present invention.

Referring to FIG. 2A is shown a cross sectional side view of a portion of the gate stack region e.g., 18A in FIG. 1. In an exemplary embodiment of the present invention, in a first step the silicon substrate 20 is cleaned prior to the optional formation of an overlying interfacial layer 22. In one embodiment, the silicon substrate is cleaned using standard cleaning 1 (SC-1) and/or standard cleaning-2 (SC-2) solutions, which may be individually or sequentially used cleaning solutions including mixtures of $NH_4OH$—$H_2O_2$—$H_2O$, and $HCl$—$H_2O_2$—$H_2O$, respectively.

In one embodiment of the invention an interfacial layer 22 is provided over the silicon substrate 20, formed of, for example one of silicon dioxide ($SiO_2$), silicon oxynitride (e.g., SiON), silicon nitride (e.g., SiN), and aluminum oxide (e.g., $Al_2O_3$). The interfacial layer 22 is preferably formed to a thickness of less than about 10 Angstroms over the silicon substrate and may be formed by conventional methods including thermal oxidation, CVD, and nitridation, including plasma assisted oxidation, CVD, and nitridation. For example in one embodiment, an $SiO_2$ interfacial layer, the $SiO_2$ layer is formed by exposure of the silicon substrate to an oxygen atmosphere to form a native oxide following the silicon substrate cleaning process.

A high-k dielectric layer 24 is deposited over the silicon substrate after the cleaning process or the optionally formed interfacial layer if provided. The high-k dielectric material preferably has a dielectric constant of greater than about 10. For example, the high-k dielectric layer is preferably formed of a metal oxide including tantalum oxides (e.g., $Ta_2O_5$), titanium oxides, (e.g., $TiO_2$), hafnium oxides (e.g., $HfO_2$), yttrium oxides (e.g., $Y_2O_3$), and lanthanum oxides (e.g., $La_2O_5$). The high-k dielectric layer 24 is preferably formed by one of metal organic CVD (MOCVD) and atomic layer deposition (ALD) or epitaxy. Other less preferably processes including plasma enhanced CVD, evaporation deposition processes, and reactive sputtering deposition processes may be used. The high-k dielectric layer 24 is preferably formed having a thickness of between about 20 Angstroms to about 100 Angstroms.

For example in a MOCVD process, a liquid metal-organic precursor is vaporized and provided over a process wafer substrate at a pressure of about 0.25 Torr to about 10 Torr, more preferably about 100 mTorr to about 500 mTorr, to dissociate on the substrate surface in the presence oxygen to form the high-k metal oxide. The MOCVD deposition process preferably takes place with the wafer substrate heated to about 350° C. to about 450° C. In the ALD process which gives superior film qualities, although a slower process, molecular layers are sequentially deposited including a molecular layer of metal precursor, for example a metal-organic precursor, followed by controlled dissociation and oxidation of the metal-organic molecular layer to form a portion of the high-k dielectric layer, the process being sequentially repeated to complete the formation of the high-k dielectric layer. The high-k dielectric layers are optionally annealed in an oxygen containing atmosphere from about 400° C. to about 800° C. following deposition to improve the oxide quality and dielectric properties. In a preferred embodiment, the high-k dielectric layers (metal oxide layers) are annealed in a mixture of ozone and oxygen, the mixture having a volumetric ratio of oxygen to ozone of about 1 to 1 to about 10 to 1 with respect to the mixture volume at a temperature of about 450° C. to about 550° C. For example, the lower temperature anneal in oxygen minimize the formation or increasing thickness of an interfacial silicon oxide layer which lowers the overall gate stack capacitance.

Following deposition of the high-k dielectric layer, a polysilicon layer 26 is preferably deposited by a low pressure CVD (LPCVD) process preferably using silane gas ($SiH_4$) as the reactive gas and nitrogen as the carrier gas for a nitrogen ambient deposition process. Preferably, the polysilicon layer 26 is deposited having a thickness of about 1500 Angstroms to about 2000 Angstroms. For example the CVD precursor gas is preferably about 15 volume percent to about 40 volume percent silane with respect to the total volume of the CVD precursor gas with the remaining volume percent portion nitrogen gas. For example the LPCVD process is preferably carried out at a pressure of about 100 milliTorr to about 1 Torr. In addition, the LPCVD process may include a cold-wall or hot-wall configuration. Preferably, the substrate temperature is maintained at about 250° C. to about 450° C.

Figure 2B:
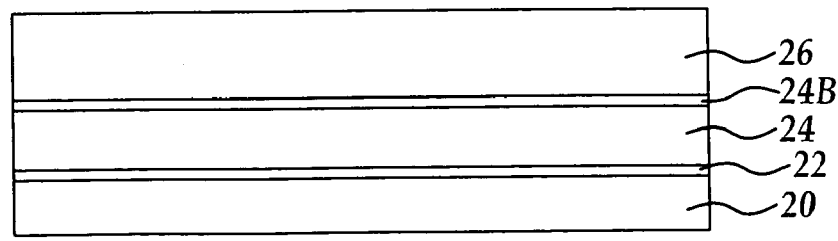

Referring to FIG. 2B, in another embodiment, the gate stack is formed in the same manner as explained with respect to FIG. 2A except that a metal oxide barrier layer, for example aluminum oxide (e.g., $Al_2O_3$) 24B is formed over the high-k dielectric layer 24 prior to the formation of the polysilicon layer 26. The barrier layer 24B prevents interaction of the high-k dielectric layer 24 with the polysilicon layer 26. As with the high-k dielectric layer 24, the aluminum oxide barrier layer is preferably formed by metal organic CVD (MOCVD), or atomic layer deposition (ALD) process, although other conventional deposition processes may be used including evaporation deposition processes and reactive sputtering deposition processes. Preferably, the aluminum oxide barrier layer 24B is formed having a thickness of less than about 15 Angstroms, more preferably about 5 to about 10 Angstroms. Following formation of the aluminum oxide barrier layer a polysilicon layer for forming the gate electrode is optionally deposited according to the preferred embodiments discussed with respect to FIG. 2A. However, additional polysilicon depositions are now suitably used including one of an LPCVD and APCVD deposition processes carried out in an ambient including at least one of nitrogen and hydrogen.

In an exemplary embodiment of the present invention, a hafnium oxide layer (e.g., $HfO_2$) was used as the high-k gate dielectric layer in a gate stack. According to an aspect of the invention, including carrying out the polysilicon layer deposition according to an LPCVD process in a nitrogen ambient according to preferred embodiments, it was found that the electrical properties including capacitance versus voltage and gate leakage current were significantly improved compared to, for example, CVD depositions of polysilicon according to atmospheric pressure CVD (APCVD) methods in either a nitrogen or hydrogen ambient.

Figure 3A:
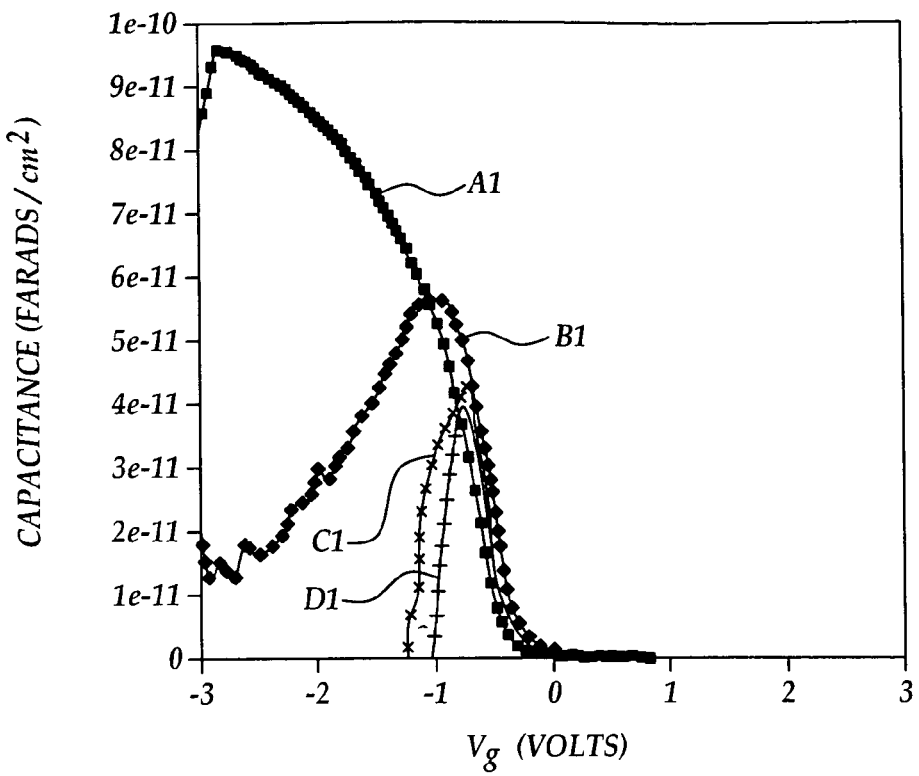
FIGS. 3A and 3B are electrical measurement data showing the performance of an exemplary device formed according to an embodiment of the present invention contrasted with device formed according to alternative methods.

For example referring to FIG. 3A, are shown capacitance values on the vertical axis and applied voltage on the horizontal axis in a conventional CV (capacitance-voltage) test. Lines B1, C1 and D1 represent respectively gates structure samples B1, C1, and D1, formed with polysilicon layer depositions carried out over the hafnium oxide high-k dielectric layer respectively using APCVD in a nitrogen ambient (B1), APCVD in a hydrogen ambient (C1), and LPCVD in a hydrogen ambient (D1). In contrast, line A1 represents the CV characteristics of sample A1 where a gate stack is formed according to a preferred embodiment of the present invention including a hafnium oxide (e.g., $HfO_2$) high-k dielectric layer and polysilicon electrode layer deposited according an LPCVD polysilicon deposition process in a nitrogen containing ambient. It is apparent that the electrical properties including CV characteristics of the gate structure formed according to preferred embodiments are improved compared to alternative processes including prior art processes.

Figure 3B:
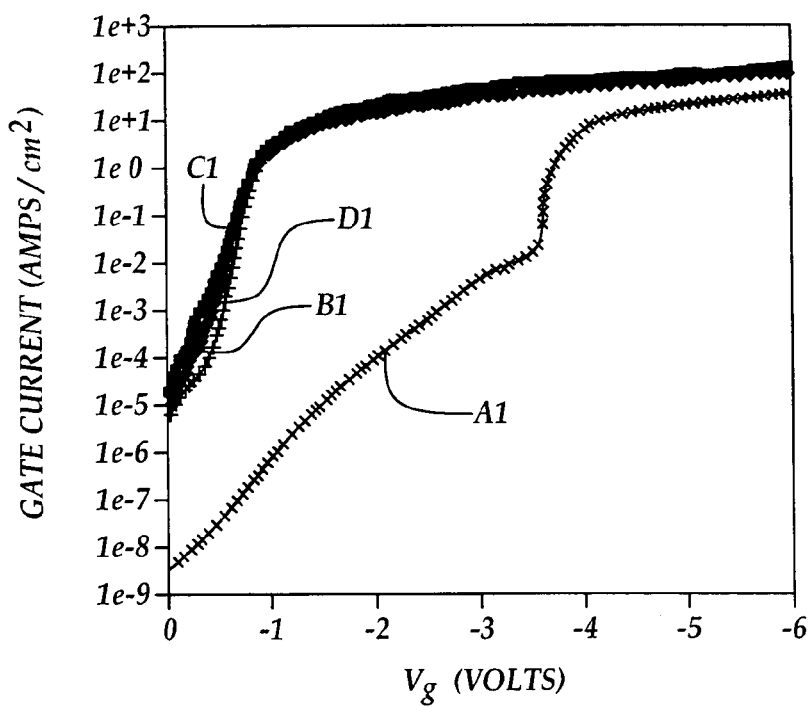

For example, referring to FIG. 3B are shown data from conventional current leakage tests performed on the same set of test samples A1, B1, C1, and D1, discussed with respect to FIG. 3A. The gate current (including leakage current) is shown on the vertical axis and the applied gate voltage is shown on the horizontal axis. With respect to samples B1, C1, and D1 the data e.g., lines B1, C1, and D1 respectively, shows about the same gate current with applied gate voltage. In contrast, sample A1 gate current as shown by line A, shows lower gate current (including lower leakage current) at a given applied voltage compared to polysilicon forming processes represented by samples B, C, and D. It is apparent that the electrical properties including gate current characteristics of the gate structure formed according to preferred embodiments are improved compared to alternative processes including prior art processes.

Figure 4A:
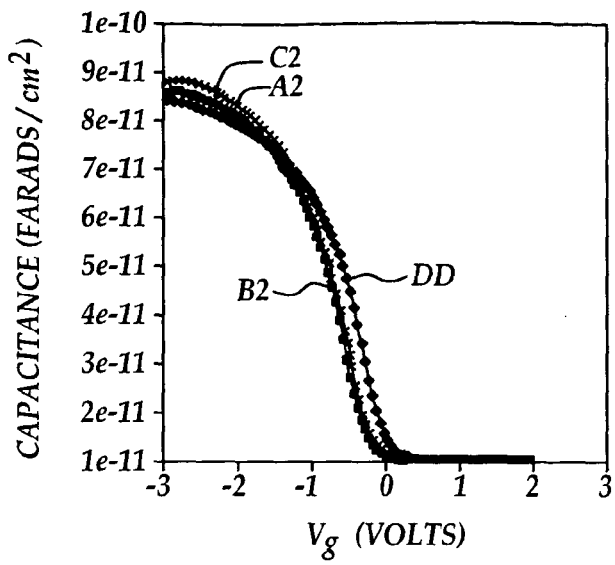
FIGS. 4A and 4B are electrical measurement data demonstrating the performance of exemplary devices formed according to an embodiment of the present invention.
Figure 4B:
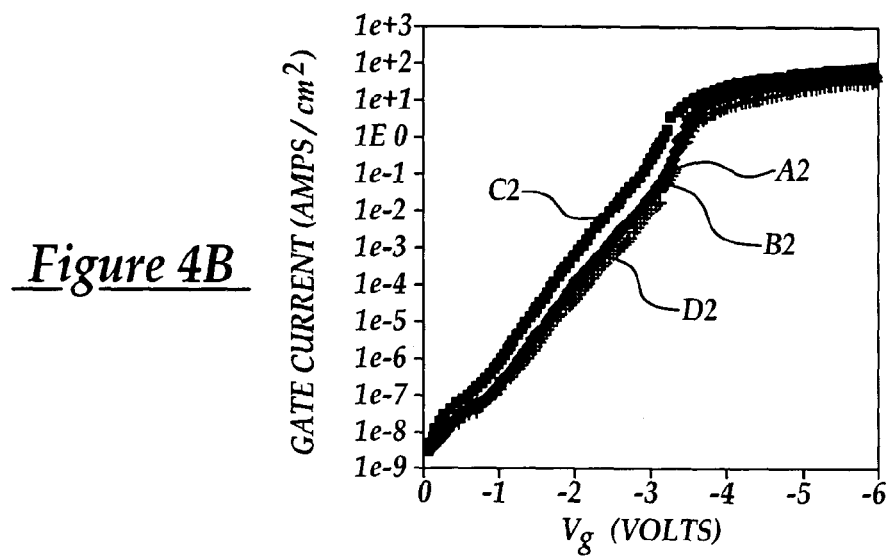

Referring to FIGS. 4A and 4B, the CV tests and gate current tests are shown for another embodiment of the invention where an aluminum oxide capping layer having a thickness of from about 5 Angstroms to about 15 Angstroms, preferably less than about 10 Angstroms is provided over the high-k dielectric layer prior to polysilicon deposition. The conditions for deposition of polysilicon as shown for samples A2, B2, C2, D2, are the same as for samples A1, B1, C1, and D1 as discussed with respect to FIGS. 3A and 3B. Although, hard to distinguish on the data shown, all samples A2, B2, C2, D2 have similar CV values as shown in FIGS. 4A and 4B. Acceptable electrical properties are now obtained for both APCVD and LPCVD deposition processes carried out in both nitrogen containing and/or hydrogen containing ambients. Thus, the addition of the aluminum oxide barrier layer according to an embodiment of the present invention advantageously provides protection of the high-k dielectric layer from the effects of polysilicon deposition processing conditions and increases the deposition options for depositing the polysilicon electrode.

Figure 5:
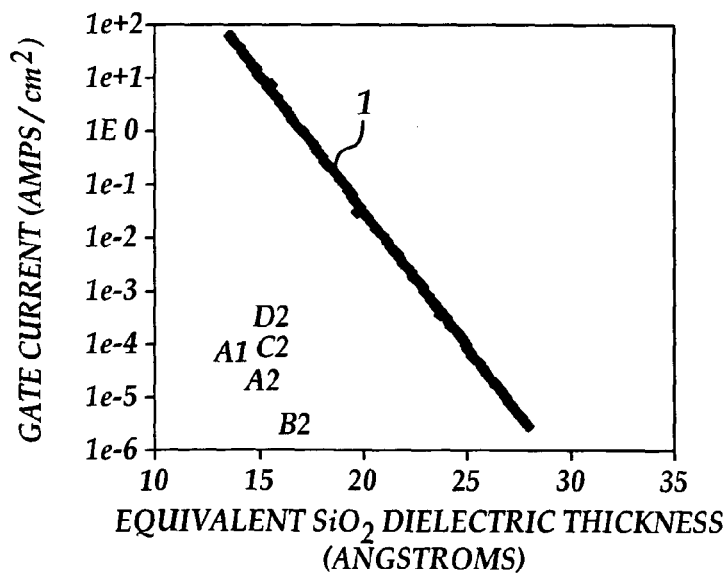
FIG. 5 is electrical measurement data showing contrasting devices formed according to preferred embodiments of the invention compared to prior art devices.

Referring to FIG. 5, is shown data where gate current is represented on the vertical axis and an equivalent dielectric thickness with respect to a silicon dioxide gate dielectric is represented on the horizontal axis. Line 1 represents values of gate current as a function of $SiO_2$ gate dielectric physical thicknesses. Also shown are representative gate current values for samples A1, A2, B2, C2, and D2 formed according to preferred embodiments of the present invention, shown representing a dielectric thickness equivalent to a silicon dioxide thickness (equivalent $SiO_2$ dielectric thickness) of between about 10 Angstroms and about 20 Angstroms, more precisely, about 15 Angstroms. It can be seen that according to devices produced according to preferred embodiments of the present invention the gate current for samples A1, A2, B2, C2, and D2 is improved (e.g., lower leakage current) about 4 to about 5 orders of magnitude at about an equivalent $SiO_2$ dielectric thickness (EOT) of about 15 Angstroms.

While the embodiments illustrated in the Figures and described above are presently preferred, it should be understood that these embodiments are offered by way of example only. The invention is not limited to a particular embodiment, but extends to various modifications, combinations, and permutations as will occur to the ordinarily skilled artisan that nevertheless fall within the scope of the appended claims.

What is claimed is:

1. A method for forming a gate stack having improved electrical properties in a gate structure forming process comprising the steps of:
   providing a semiconductor substrate;
   forming a metal oxide layer over an exposed portion of the semiconductor substrate; and
   forming a silicon-containing electrode layer over the metal oxide layer by depositing a silicon layer and introducing a nitrogen containing ambient simultaneously.

2. The method of claim 1, wherein the metal oxide layer comprises a dielectric constant of greater than about 20.

3. The method of claim 1, wherein the metal oxide is formed having a thickness of about 20 Angstroms to about 100 Angstroms.

4. The method of claim 1, wherein the gate stack including the metal oxide layer is formed to have a dielectric thickness equivalent to a silicon dioxide dielectric thickness of less than about 20 Angstroms.

5. The method of claim 3, wherein the metal oxide is selected from the group consisting of tantalum oxides, titanium oxides, zirconium oxides, hafnium oxides, and yttrium oxides.

6. The method of claim 5, wherein the metal oxide is formed from one of a metal-organic CVD method and an atomic layer deposition (ALD) method.

7. The method of claim 6, wherein an ozone containing oxidation process is carried out to treat the metal oxide layer following the formation of the metal oxide layer.

8. The method of claim 1, wherein a layer comprising aluminum oxide is formed over the metal oxide layer.

9. The method of claim 8, wherein the aluminum oxide layer is formed having a thickness of about 5 Angstroms to about 15 Angstroms.

10. A method for forming a gate stack having improved electrical properties in a gate structure forming process comprising the steps of:
    providing a semiconductor substrate;
    forming a metal oxide layer over an exposed portion of the semiconductor substrate; and
    depositing a polysilicon electrode over the metal oxide layer by a low pressure chemical vapor deposition (LPCVD) process simultaneously in association with a nitrogen containing ambient.

11. The method of claim 10, wherein the LPCVD process comprises a cold-wall and a hot-wall configuration.

* * * * *